United States Patent [19]
Shen et al.

[11] Patent Number: 5,536,958
[45] Date of Patent: Jul. 16, 1996

[54] SEMICONDUCTOR DEVICE HAVING HIGH VOLTAGE PROTECTION CAPABILITY

[75] Inventors: Zheng Shen, Chandler; Stephen P. Robb, Tempe, both of Ariz.

[73] Assignee: Motorola, Inc., Schaumburg, Ill.

[21] Appl. No.: 433,883

[22] Filed: May 2, 1995

[51] Int. Cl.$^6$ .................................................. H01L 23/62
[52] U.S. Cl. ........................................ 257/356; 257/355
[58] Field of Search .................................. 257/356, 355, 257/551, 451, 454

[56] References Cited

U.S. PATENT DOCUMENTS

| | | | |
|---|---|---|---|
| 3,798,514 | 3/1974 | Hayashi et al. | 257/480 |
| 4,774,560 | 9/1988 | Coe | 257/484 |
| 5,365,099 | 11/1994 | Phipps et al. | |

OTHER PUBLICATIONS

T. Yamazaki et al., "The IGBT with Monolithic Overvoltage Protection Circuit", 5th International Symposium on Power Semiconductor Devices and ICs, May 1993, Monterey, California, pp. 41–45.

*Primary Examiner*—Stephen D. Meier

[57] ABSTRACT

A semiconductor device is presented having an improved high voltage protection scheme that comprises an integrated Schottky diode (28) in conjunction with a plurality of back to back diodes (29) to limit a voltage potential that may arise between the gate (26) and drain terminals (27) of a semiconductor device. A second embodiment comprises a contact region (43) connected to a plurality of back to back diodes (46) configured so that some of the voltage is supported by the back to back diodes (46) and the remainder is supported by the substrate (39). These structures will support any excess voltage in the conduction mode, rather than the avalanche mode and may employ the use of a depletion region (51) to support a blocking voltage.

13 Claims, 2 Drawing Sheets

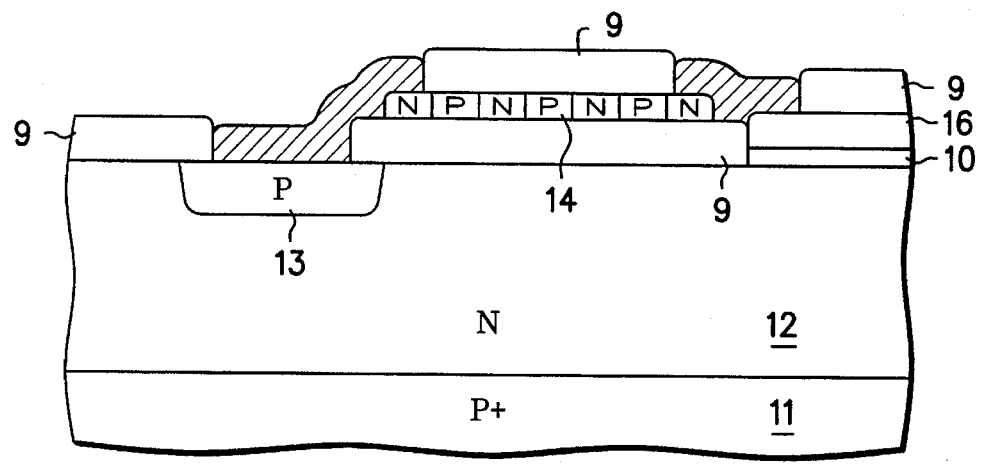
FIG. 1 - PRIOR ART -
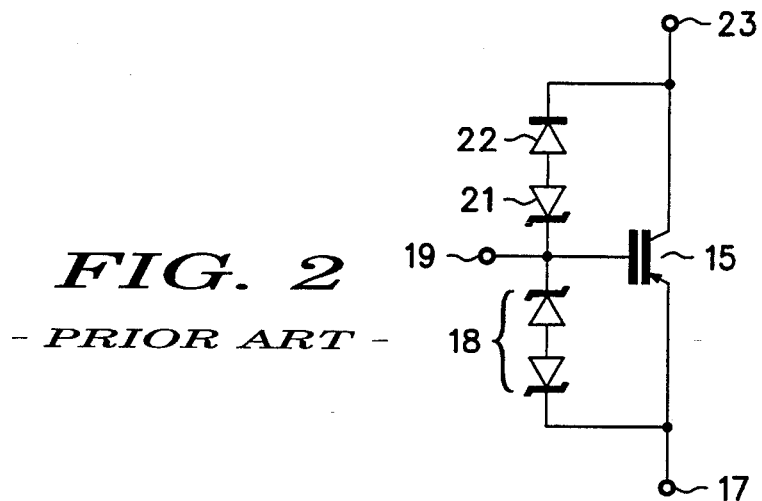
FIG. 2
- PRIOR ART -
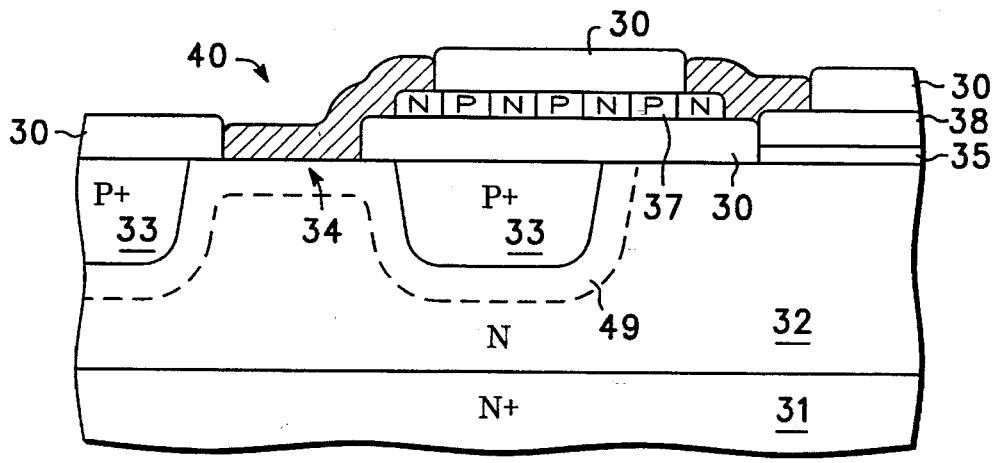
FIG. 3

SEMICONDUCTOR DEVICE HAVING HIGH VOLTAGE PROTECTION CAPABILITY

BACKGROUND OF THE INVENTION

This invention relates, in general, to semiconductor devices and, more particularly, to over voltage protection structures and methods of integration into a semiconductor device to achieve high avalanche voltage protection capabilities.

In the past, semiconductor devices have been exposed to potentially destructive voltages and currents during normal operation. Such conditions are commonly encountered in the application of power semiconductor devices such as MOSFETs, BJTs, and IGBTs. For example, a semiconductor power device such as a power MOSFET, is frequently used to switch inductive loads in a circuit. When the power MOSFET is switched off, the energy stored in the inductor will force the drain voltage of the power MOSFET to rise rapidly above the supply voltage. If no limiting means are employed, this rise will continue until the drain-source avalanche voltage of the power MOSFET is reached, whereupon the energy stored in the inductor will be dissipated in the power MOSFET during device avalanche resulting in stress-induced failure of the power MOSFET.

Various processing techniques are commonly employed to reduce the internal parasitic elements of a power MOSFET thus making it less susceptible to avalanche-stress induced failure. A problem with relying on process modifications is that normal variations in the processing parameters of a power MOSFET may inhibit the optimization or reduce the effectiveness of these techniques.

Other methods of protection involve the application of external devices to render the power MOSFET less susceptible to avalanche stress. One such method involves the deployment of a drain-source clamp diode: an external diode connected between the drain and source of the power MOSFET, whose avalanche voltage is less than that of the power MOSFET. When the rising drain-source voltage reaches the avalanche voltage of the drain-source clamp diode, the energy stored in the inductor is dissipated in the drain-source clamp diode rather than the power MOSFET. The amount of energy that can be safely dissipated in this fashion depends on the dissipation capability of the drain-source clamp diode. Large amounts of energy may require numerous clamp diodes. It should be noted that in the above-mentioned technique that while the drain-source clamp diode is dissipating the inductive energy, the power MOSFET is idle.

A more advantageous method of protection involves diverting a small fraction of the inductive energy to the power MOSFET gate by means of a drain-gate clamp diode whose avalanche voltage is less than the avalanche voltage of the power MOSFET. A suitable gate-source termination resistor is also employed in this method. When the rising drain voltage reaches the avalanche voltage of the drain-gate clamp diode, the resulting avalanche current develops a voltage across the gate-source termination resistor which turns on the power MOSFET, effectively clamping its drain voltage to the sum of the drain-gate diode avalanche voltage and the voltage across the gate-source termination resistor. In this method the power MOSFET acts as its own clamp, and dissipates the inductive energy in the less stressful conduction mode. It is customary to add a second blocking diode in back-to-back configuration with the drain-gate clamp diode to enable the gate-source voltage in normal operation to exceed the drain-source voltage.

An advantage of using a drain-gate clamp over using a drain-source clamp is that the drain-gate diode, blocking diode, and gate-source termination resistor only need to handle enough energy to charge the power MOSFET input capacitances and therefore may be small in size and cost.

A disadvantage of these external clamp methods is that additional parts are needed to protect the power MOSFET, thus increasing the cost of the total system. In addition, the physical layout of some applications may preclude placing the clamp circuitry in close proximity to the power MOSFET. The resulting parasitic inductances act as impedances that slow the response time of the clamp circuitry. Therefore the power MOSFET may have to endure some avalanche stress until the clamps become active. It would be advantageous to provide a means of protecting the power MOSFET that achieves intimate proximity to the power MOSFET and does not increase the number of additional system components.

One single chip solution was taught in U.S. Pat. No. 5,365,099 issued on Nov. 15, 1994. In this patent, a plurality of back to back polysilicon diodes are used to limit the voltage potential that may arise between the gate and drain terminal. These diodes not only protect the device, but provide the added feature of doing so with a temperature compensated sustaining voltage. This solution is limited, however, to applications where the maximum avalanche voltage the MOSFET will be exposed to is 400 volts. Increasing the number of poly diodes will ultimately maximize the blocking voltage a semiconductor device can support. There are physical and performance limitations that do not provide protection for higher voltage MOSFET devices with blocking voltages above 800 volts.

In an effort to break the 500 volt barrier, it has been suggested in the literature, publication by Yamazaki from the 1993 International Symposium on Power Semiconductor Devices and ICs pages 41–45, that an avalanche diode structure can be built in conjunction with the MOSFET device using P-N junctions. The junctions can be fabricated along with the device with no added expense or processing steps. These structures can provide the protection necessary to survive voltage spikes in excess of 1000 volts, however the circular nature of these implanted avalanche junctions makes it extremely difficult to reproduce avalanche diodes with consistent avalanching characteristics. It is also not possible to achieve optimal MOSFET device performance and optimize the desired voltage protection without either sacrificing MOSFET performance or introducing variability in the voltage range that the avalanche diode will operate.

By now, it should be appreciated that it would be advantageous to provide an improved method of protecting a semiconductor device from avalanche stress at voltages in excess of 500 volts, but it should also be a single chip solution that is easy and efficient to manufacture without impeding the MOSFET performance.

BRIEF DESCRIPTION OF THE DRAWINGS

FIG. 1 is an enlarged cross-sectional view showing the location and use of a previously known P-N junction to provide circuit protection.

FIG. 2 is a circuit schematic showing the previously known use of an avalanche diode to provide circuit protection.

FIG. 3 is an enlarged cross-sectional view showing the first embodiment of the current invention.

DETAILED DESCRIPTION OF THE DRAWINGS

Figure 4:
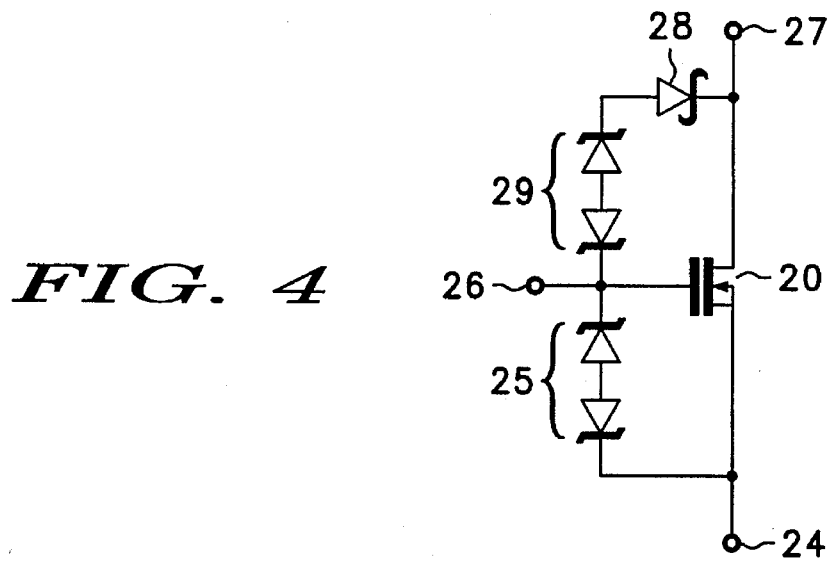
FIG. 4 is a circuit schematic showing a first embodiment of the current invention.

FIG. 1 is an enlarged cross-sectional view of a previously known high voltage protection method. First a semiconductor substrate 11 of a first conductivity type is provided. Substrate 11 is preferably silicon of either N or P type material. Next an active area 12, of a second conductivity type, is deposited on the substrate 11. The active area 12 is then selectively doped with a higher concentration of the same conductivity type as the substrate 11 and diffused to form a P-N junction region 13 that is circular in nature. The selective doping process is very critical to the performance of the protection structure and, if no additional process steps are used, is formed during the processing steps intended to optimized the MOSFET device. Variations in the implant dose, diffusion cycle, or implant openings, will cause undesirable variations in the voltage range that the structure will protect against. This P-N junction 13 will provide some, but not all, of the sustaining voltage necessary for operation, therefore a series of polysilicon diodes 14 is formed on an insulating layer 9 to electrically connect the P-N junction 13 and a gate terminal 16. The polysilicon diodes 14 will provide the remaining sustaining voltage and provide the blocking voltage that allows the potential at the gate terminal 16 to be 10-15 volts higher than the substrate 11 during normal operation of the device. In the above-mentioned embodiment, the semiconductor structure to be protected is an IGBT with a gate electrode 16 which is contiguous to an insulating layer 10 typically made of silicon dioxide.

FIG. 2 is a circuit schematic of a previously known method of integrating the avalanche diode 22 into a typical IGBT device 15. The avalanche diode 22 is electrically connected to the collector terminal 23 and the additional polysilicon diodes 21 are placed in series with the gate terminal 19. It is general practice of someone skilled in the art, to place ESD zener diodes 18 between the gate terminal 19 and the emitter terminal 17 to protect against ESD events.

FIG. 3 illustrates an enlarged cross-sectional view of a structure embodying the present invention that offers voltage protection above 500 volts without any additional process steps and does not have the sensitivity to process variation as seen in the prior art. Here a structure for an N-channel device will be described, however, the high voltage clamp 40, comprising a Schottky diode 34 and a plurality of back to back polysilicon diodes 37, can be integrated into a P-channel device or an IGBT as well. A semiconductor substrate 31 of a first conductivity, typically N-type material, is provided and acts as a drain terminal. An active region 32 is deposited on the substrate 31 which is made of an N-type material with a lighter concentration than the substrate 31. In the next step, P-type pinch-off structures 33 are created during the formation of the channel region of the semiconductor device to be protected (not shown) using selective implanting. In this embodiment the P-type dopant used is a boron source at a dose of approximately $5 \times 10^{14}$ to $1 \times 10^{16}$ atoms/cm$^2$. Other P-type dopants are also suitable. An insulating layer 30, preferably made of silicon dioxide, is deposited on the active area 32 and selectively patterned to expose portions of the active area 32 near the pinch-off structures 33. The size and number of the openings in the active region 32 will determine the current density of the high voltage clamping device 40 which is critical to minimize reliability degradation due to electromigration. The zener diodes 37 can be formed many ways including as taught in U.S. Pat. No. 5,365,099 and are typically placed on the insulating layer 30 on the active region 32. The other end of the zener diode chain 37 is electrically connected to the controlling electrode 38 of the semiconductor device to be protected. The controlling electrode 38 typically resides on an insulating layer 35 made of silicon dioxide. The size and number of diodes formed in the diode chain 37 can be varied to adjust the voltage protection desired for each particular application. A metal film is deposited by techniques used by those skilled in the art such as sputtering or evaporation and can consist of any one of the materials used in the industry such as Al, AlCu, AlCuSi, Au, etc. The metal film is then selectively etched to form the metallized region 34 which will produce a Schottky diode 34 with the active area 32 and make electrical contact to the series of back to back zener diodes 37. The etched metal film also electrically connects the pinch-off structures 33 to the source or emitter terminal of the semiconductor device to be protected (not shown). The pinch-off structures 33 should be placed such that they are in close proximity to the Schottky diode 34 and must be placed such that the Schottky diode 34 will be inside the depletion region 49 when a high voltage bias, on the order of 300-1200 volts, is applied to the substrate 31. The depletion region 49 will support some of the voltage present at the substrate 31 and help reduce the amount of voltage needed to be supported by the Schottky diode 34. The preferred structure forms the pinch-off structure 33 by placing Schottky diode 34 in the center of a 'doughnut' shaped structure formed by the P-type dopant. The pinch-off structures 33 are 0 to 25 microns from the edge of the Schottky diode 34 and completely encircle the Schottky diode 34. The width of the Schottky diode region and the spacing between the pinch-off structures 33 and the Schottky diode will determine the blocking voltage of the clamping device and can be adjusted accordingly. In the preferred embodiment, the pinch-off structures 33 are at least 10 microns from the edge of the Schottky diode 34. This embodiment is not limited to this specific implementation as single or multiple pinch-off structures 33 can be used and can even overlap portions of the Schottky diode 34.

FIG. 4 illustrates a circuit diagram of an embodiment of the present invention. A power MOSFET device 20 will be used to illustrate where and how the present invention may be integrated to provide high voltage protection, however, the invention is not limited to this specific device. The present device can be used in other semiconductor devices such as a bipolar transistor or an insulated gate bipolar transistor (IGBT). The MOSFET 20 has a gate electrode or control electrode 26, a source electrode 24, and a drain electrode or a current carrying electrode 27. In a bipolar device the gate would correspond to a base, the source to an emitter, and a drain to a collector. A plurality of ESD diodes 25 may be electrically connected between the gate electrode 26 and the source electrode 24. The Schottky diode 28 is placed electrically in series with a plurality of polysilicon diodes 29 between the gate electrode 26 and the drain electrode 27. The diodes 29 are added to the Schottky diode 28 to provide protection from over voltage stress above 500 volts.

In previously known methods of MOSFET fabrication, typical protection schemes have relied on the used of P-N junctions, either external or integrated with the MOSFET, to protect from avalanche stress. The use of Schottky diodes is new to MOSFET processing because during the evolution of optimizing the MOSFET performance, designs have relied on the use of ohmic contacts to reduce parasitic resistance. It will also be apparent to those skilled in the art of processing MOSFETs, that no additional processing steps are required to make the present invention.

Figure 5:
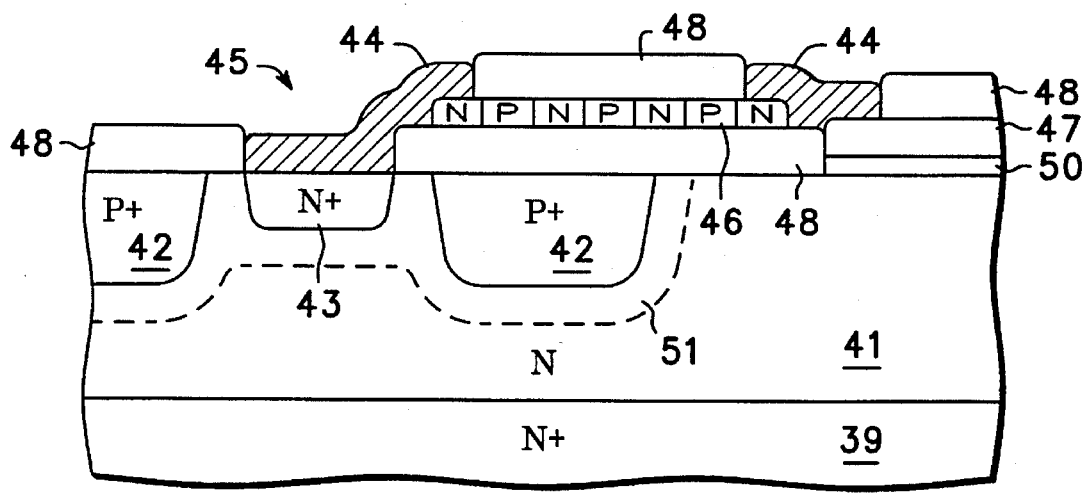
FIG. 5 is an enlarged cross-sectional view showing a second embodiment of the current invention.

The Schottky diode element 28 of FIG. 4 can be replaced with a voltage sensing element (not shown) to represent a second embodiment of the present invention. FIG. 5 illustrates an enlarged cross-sectional view of a structure embodying the present invention. Here a structure for an N-channel device will be described, however, the high voltage clamping device can be integrated into a P-channel device or an IGBT. A semiconductor substrate 39 of a first conductivity, made of N-type material with a dopant concentration on the order of $5 \times 10^{19}$, is provided and acts as a drain electrode. An active region 41 is deposited on the substrate 39 and is made of an N-type material with a lighter dopant concentration than the substrate 39. In the next step, P-type pinch-off structures 42 of a second conductivity are created during the formation of the source and drain regions or collector and emitter regions using selective implanting. In this embodiment, the P-type dopant used is a boron source at a dose of approximately $5 \times 10^{14}$ to $1 \times 10^{16}$ atoms/cm$^2$. Other P-type dopants are also suitable. The active area 41 either near, adjacent, or overlapping the pinch-off structures 42 is then selectively implanted with an N-type dopant to form the ohmic contact region 43 with higher doping concentration than the active area 41. The N-type dopant used in this embodiment is a phosphorus source at a dose of approximately $5 \times 10^{13}$ to $5 \times 10^{16}$ atoms/cm$^2$. Other N-type dopants are also suitable. Since a P-N junction, as presented in the paper by Yamazaki, is not being formed, the implant and diffusion steps used to form the contact region 43 are not subjected to the same tight processing tolerances. An insulating layer 48 is deposited on the active area 41 and selectively patterned to expose portions of the contact region 43. The size and number of the openings in the active area 41 will determine the current density of the high voltage clamping device 45 which is critical to minimize reliability degradation due to electromigration. The zener diodes 46 can be formed many ways including as taught in U.S. Pat. No. 5,365,099 and are typically placed on the insulating layer 48. The other end of the zener diode chain 46 is electrically connected to the controlling electrode 47 of the semiconductor device to be protected. The controlling electrode 47 typically resides on an insulating layer 50 consisting of silicon dioxide. The size and number of diodes formed can be varied to adjust the voltage protection desired for each particular application. A metallization layer is deposited and etched to form an electrical contact 44 between the contact region 43 and one end of a chain of polysilicon diodes 46. The metallization layer also provides electrical contact between the pinch-off structures 42 and the source or collector terminal of the semiconductor device to be protected. The pinch-off structures 42 should be placed so they are in close proximity to the contact region 43 and must be placed such that the contact region 43 will be inside the depletion region 51 when a high voltage bias, on the order of 300–1200 volts, is applied to the substrate 39. The depletion region 51 will support some of the voltage potential present at the substrate 39 and help reduce the amount of voltage needed to be supported by the zener diode chain 46. The preferred design forms the pinch-off structures 42 by placing the contact region 43 in the center of a 'doughnut' shaped structure formed by the P-type dopant. The pinch-off structures 42 are 0 to 25 microns from the edge of the contact region 43 and completely encircle the contact region 43. In the preferred embodiment, the pinch-off structures 42 are at least 10 microns from the edge of the contact region 43. This embodiment is not limited to this specific implementation as single or multiple pinch-off structures 42 can be used and can even overlap portions of contact region 43.

This second embodiment does not require any additional process steps to form the contact region 43, and like the first embodiment, it offers improved high voltage protection over the previously known solutions since there is no dependency on the shape or depth of an implanted avalanche P-N diode. The above-mentioned embodiments of the invention do not limit the maximum blocking voltage that can be supported, and can provide protection for semiconductor devices from voltages well above 500 volts without any impact on device performance.

By now it should be appreciated that there have been provided new methods of protecting a semiconductor device from avalanche stress due to voltages exceeding 500 volts. The embodiments can be used individually or combined in plurality or used together to protect the same semiconductor device from high voltage stress.

We claim:

1. A power MOSFET device having high voltage protection from voltages exceeding 500 volts, comprising:

a semiconductor substrate of a first conductivity type serving as a drain electrode;

an active region of the first conductivity type deposited on the semiconductor substrate;

an insulating layer contiguous to the active region;

a gate electrode contiguous to the insulating layer;

at least one metallized region contacting the active region to form a Schottky diode;

a plurality of back to back diodes electrically connected between the Schottky diode and the gate electrode to support any remaining voltage potential at the Schottky diode; and wherein the Schottky diode has an anode terminal and a cathode terminal, the cathode terminal being connected to the drain electrode and the anode terminal being connected to the gate electrode so that a reverse bias current flow is from the drain electrode to the gate electrode.

2. The power MOSFET device of claim 1 further comprising:

at least one pinch-off structure of a second conductivity type located in close proximity to the Schottky diode such that the Schottky diode will be inside a depletion region when a potential is applied to the drain electrode.

3. A high voltage clamping device to protect a semiconductor device from voltages exceeding 500 volts, comprising:

a semiconductor substrate of a first conductivity type;

an active region of the first conductivity type deposited on the semiconductor substrate;

a Schottky diode formed by a metallized region contacting the active region;

a plurality of back to back diodes formed on the active region and electrically connecting the Schottky diode and a control electrode of the semiconductor device; and wherein the Schottky diode has an anode terminal and a cathode terminal, the cathode terminal being connected to the active region and the anode terminal being connected to the control electrode so that a reverse bias current flow is from the active region to the control electrode.

4. The high voltage clamping device of claim 3 wherein the plurality of back to back diodes are formed in a layer of polysilicon located on an insulating layer on the active region.

5. The high voltage clamping device of claim 3 further comprising:

at least one pinch-off structure of a second conductivity type located in close proximity to the Schottky diode such that the Schottky diode will be inside a depletion region when a potential is present at the semiconductor substrate.

6. The high voltage clamping device of claim 3 wherein the semiconductor device is a bipolar transistor or an insulated gate bipolar transistor.

7. A high voltage clamping device to protect a semiconductor device from voltages exceeding 500 volts, comprising:

a semiconductor substrate of a first conductivity type;

an active region of the first conductivity type deposited on the semiconductor substrate;

at least one contact region of the first conductivity type located in the active region;

at least one pinch-off structure of a second conductivity type located in close proximity to the at least one contact region such that the at least one contact region will be inside a depletion region when a potential is present at the semiconductor substrate;

a plurality of back to back polysilicon diodes formed on the active region, wherein the plurality of back to back polysilicon diodes are electrically connected between a control electrode of the semiconductor device and the at least one contact region; and wherein a reverse bias current flow is from the at least one contact region to the control electrode.

8. The high voltage clamping device of claim 7 wherein the plurality of back to back diodes are formed in a layer of polysilicon located on an insulating layer on the active region.

9. The high voltage clamping device of claim 7 wherein the at least one pinch-off structure is at least 10 microns from the at least one contact region.

10. The high voltage clamping device of claim 7 wherein the semiconductor device is a MOSFET.

11. The high voltage clamping device of claim 7 wherein the semiconductor device is a bipolar transistor or an insulated gate bipolar transistor.

12. A power MOSFET device having high voltage protection from voltages exceeding 500 volts, comprising:

a semiconductor substrate of a first conductivity type serving as a drain electrode;

an active region of the first conductivity type deposited on the semiconductor substrate;

an insulating layer contiguous to the active region;

a gate electrode contiguous to the insulating layer;

at least one contact region of the first conductivity type located in the active region;

at least one pinch-off structure of a second conductivity type located in close proximity to the at least one contact region such that the at least one contact region will be inside a depletion region when a potential is present at the drain electrode;

a plurality of back to back polysilicon diodes formed on the active region, wherein the plurality of back to back diodes are connected electrically between the at least one contact region and the gate electrode; and wherein a reverse bias current flow is from the at least one contact region to the gate electrode.

13. The power MOSFET device of claim 12 wherein the plurality of back to back diodes are formed in a layer of polysilicon located on an insulating layer on the active region.

* * * * *